United States Patent
Chandra et al.

(10) Patent No.: US 9,722,045 B2
(45) Date of Patent: Aug. 1, 2017

(54) BUFFER LAYER FOR MODULATING VT ACROSS DEVICES

(71) Applicant: GLOBALFOUNDRIES Inc., Grand Cayman (KY)

(72) Inventors: Bhupesh Chandra, Jersey City, NJ (US); Viorel Ontalus, Danbury, CT (US); Timothy J. McArdle, Hopewell Junction, NY (US); Paul Chang, Mahopac, NY (US); Claude Ortolland, Peekskill, NY (US); Judson R. Holt, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/921,434

(22) Filed: Oct. 23, 2015

(65) Prior Publication Data
US 2017/0117387 A1   Apr. 27, 2017

(51) Int. Cl.
*H01L 21/336* (2006.01)
*H01L 29/66* (2006.01)
*H01L 21/225* (2006.01)

(52) U.S. Cl.
CPC .... *H01L 29/66575* (2013.01); *H01L 21/2254* (2013.01)

(58) Field of Classification Search
None
See application file for complete search history.

(56) References Cited

U.S. PATENT DOCUMENTS

| | | | | |
|---|---|---|---|---|
| 2003/0183856 A1* | 10/2003 | Wieczorek | ...... | H01L 21/823807 257/285 |
| 2005/0079692 A1* | 4/2005 | Samoilov | ............ | H01L 21/0245 438/481 |
| 2005/0285212 A1* | 12/2005 | Tolchinsky | ......... | H01L 29/1054 257/408 |
| 2006/0223252 A1* | 10/2006 | Park | ................ | H01L 21/823828 438/197 |
| 2007/0235802 A1* | 10/2007 | Chong | ............ | H01L 21/823807 257/346 |

* cited by examiner

*Primary Examiner* — Whitney T Moore
*Assistant Examiner* — Herve Assouman
(74) *Attorney, Agent, or Firm* — Anthony Canale; Andrew M. Calderon; Roberts Mlotkowski Safran Cole & Calderon, P.C.

(57) ABSTRACT

The disclosure relates to semiconductor structures and, more particularly, to one or more devices with an engineered layer for modulating voltage threshold (Vt) and methods of manufacture. The method includes finding correlation of thickness of a buffer layer to out-diffusion of dopant into extension regions during annealing of a doped layer formed on the buffer layer. The method further includes determining a predetermined thickness of the buffer layer to adjust device performance characteristics based on the correlation of thickness of the buffer layer to the out-diffusion. The method further includes forming the buffer layer adjacent to gate structures to the predetermined thickness.

19 Claims, 4 Drawing Sheets

Greater percent of boron than upper points

BUFFER LAYER FOR MODULATING VT ACROSS DEVICES

FIELD OF THE INVENTION

The present disclosure relates to semiconductor structures and, more particularly, to one or more devices with an engineered layer for modulating voltage threshold (Vt) and methods of manufacture.

BACKGROUND

The threshold voltage of a field-effect transistor (FET) is the minimum gate-to-source voltage differential that is needed to create a conducting path between the source and drain terminals. The ability to control threshold voltage (Vt) in devices is critical for device performance and such control has proved difficult, particularly in pFETs which suffer from high Vt.

SUMMARY

In an aspect of the disclosure, a method finding correlation of thickness of a buffer layer to out-diffusion of dopant into extension regions during annealing of a doped layer formed on the buffer layer. The method further includes determining a predetermined thickness of the buffer layer to adjust device performance characteristics based on the correlation of thickness of the buffer layer to the out-diffusion. The method further includes forming the buffer layer adjacent to gate structures to the predetermined thickness.

In an aspect of the disclosure, a method comprising method comprising controlling out-diffusion of dopant from a doped epitaxial grown layer into an extension region of a device by adjusting Ge % or C % concentration introduced into the doped epitaxial grown layer.

In an aspect of the disclosure, a method includes: forming gate structures; forming a buffer layer adjacent to the gate structures; forming a doped layer on the buffer layer; annealing the doped layer to out-diffuse dopant into extension regions; and adjusting an out-diffusion of the dopant during the annealing by one of: adjusting a thickness of the buffer layer by an etching process and adjusting a concentration of Ge or C of the doped layer.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 1b shows a top view of the structure of FIG. 1a.

DETAILED DESCRIPTION

The present disclosure relates to semiconductor structures and, more particularly, to devices with an engineered layer for modulating voltage thresholds (Vt) and methods of manufacture. More specifically, the present disclosure provides an engineered buffer layer at an SiGe (or SiC)—Si interface for modulating Vt across different devices on a chip. Also, the present disclosure provides an engineered doped layer on the buffer layer for modulating voltage thresholds (Vt). For example, Vt can be controlled by modulating the concentration of, e.g., Ge % or C %, in the doped layer. In further embodiments, Vt can be controlled by modulating the concentration of, e.g., Ge % or C %, in the buffer layer. In further embodiments, Vt can be controlled by any combinations of the engineered layers as described herein.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1A:
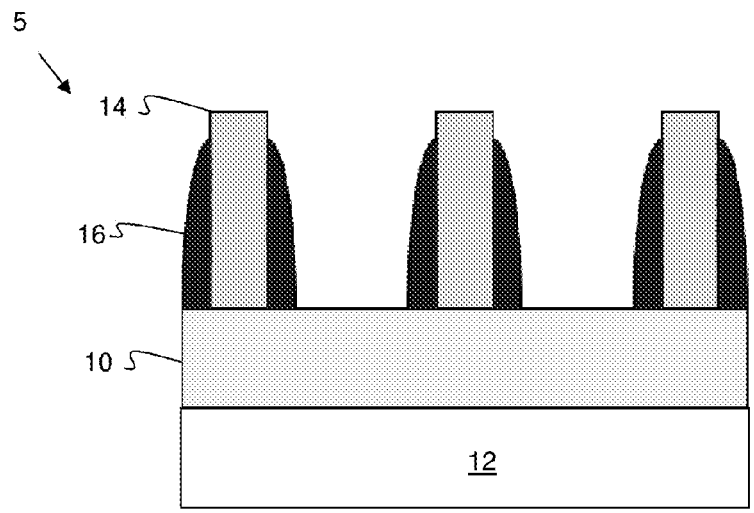
FIG. 1a shows a cross-sectional view of a structure and respective fabrication processes in accordance with aspects of the present disclosure.
Figure 1B:
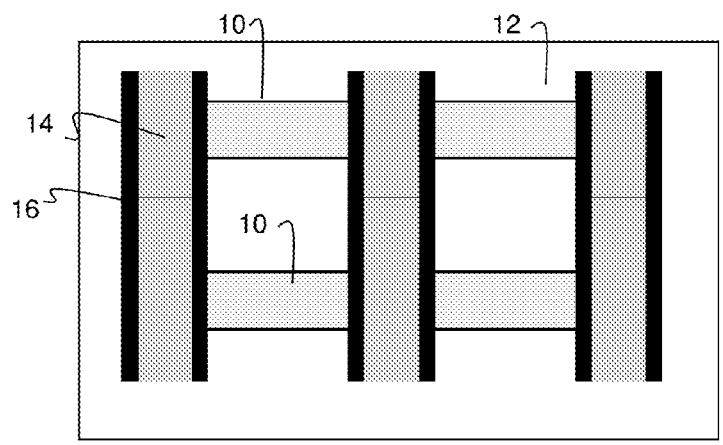

FIG. 1a shows a cross-sectional view of a structure in accordance with aspects of the present disclosure, and FIG. 1b shows a top view of the structure of FIG. 1a. Referring to both FIGS. 1a and 1b, the structure 5 includes one or more fin structures 10 formed on an insulator layer 12, e.g., oxide layer. In embodiments, the fin structures 10 can be composed of any semiconductor material, e.g., Si, SiGe, SiGeC, SiC, GaAs, InAs, InP, etc. In preferred embodiments, the fin structures 10 are formed from a silicon-on-insulator (SOI) wafer using conventional lithography and etching techniques. For example, the fin structures 10 can be formed using sidewall image transfer (SIT) techniques.

In the SIT technique, for example, a mandrel is formed on the upper semiconductor layer, using conventional deposition, lithography and etching processes. The mandrel material can be, e.g., SiO$_2$, deposited on the semiconductor material using conventional CVD processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions to form both narrow fin structures and/or wide fin structures. Spacers are formed on the sidewalls of the mandrels which are preferably material that is different than the mandrels, and which are formed using conventional deposition processes known to those of skill in the art. The spacers can have a width which matches the dimensions of the fin structures 10, for example. The mandrels are removed or stripped using a conventional etching process, selective to the mandrel material. An etching is then performed within the spacing of the spacers to form the sub-lithographic features. The sidewall spacers can then be stripped.

After formation of the fin structures 10, a plurality of gate structures 14 are formed over the fin structure 10. In embodiments, the gate structures 14 can be formed by deposition of gate material over the fin structures 10, followed by a lithography and etching process to pattern the gate structures 14. For example, the gate material can include deposition of a gate dielectric material (e.g., high-k dielectric material such as a hafnium oxide) followed by a deposition of different work function materials, e.g., metal or metal alloy materials, on the fin structures 10 and over any exposed insulator material 12. In embodiments, the deposition of these materials can be, e.g., a chemical vapor deposition (CVD) process; although other deposition processes are also contemplated by the present disclosure. A resist material can be formed over the gate material, and exposed to energy (light) to form openings. The gate material can then undergo an etching process (reactive ion etching (RIE) through the openings to form (pattern) the gate structures 14. The resist can be removed through a conventional processes, e.g., oxygen ashing or other strippants. In embodiments, the gate structures 14 are positioned orthogonal to the fin structures 10.

Still referring to FIGS. 1a and 1b, the gate structures 14 include sidewalls or spacers 16. The sidewalls or spacers 16 can be a nitride material, as an example, deposited using conventional deposition methods, e.g., CVD. After deposition of the sidewall or spacer material, an anisotropic etching process can be performed to form the sidewalls or spacers 16 on the sidewalls of the gate structures 14.

Figure 2:
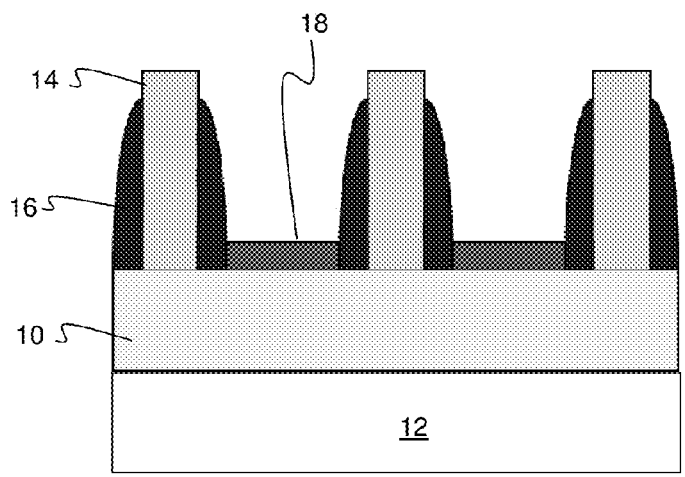
FIG. 2 shows a structure with a buffer layer and respective fabrication processes in accordance with aspects of the present disclosure.

FIG. 2 shows epitaxial layer 18 formed between the gate structures 14, and more specifically between the sidewalls or spacers 16 of adjacent gate structures 14. In embodiments, the epitaxial layer 18 is a buffer layer located between the semiconductor material of the fin structure and a subsequently deposited doped layer (see, e.g., FIG. 4, layer 20). In embodiments, the epitaxial layer 18 can be, e.g., non-doped semiconductor material formed by a growth process. The non-doped semiconductor material can be, e.g., Si, SiGe or SiC, depending on the desired characteristics of the device. For example, SiGe material can be used for a pFET device; whereas, SiC material can be used for an nFET device. In still alternative embodiments, SiGe material can be used for an nFET device and the SiC material can be used for a pFET device, but in lower concentrations so as to not affect the strain of these devices. The epitaxial layer 18 can be grown to a thickness of about 5 Å to about 100 Å.

Figure 3:
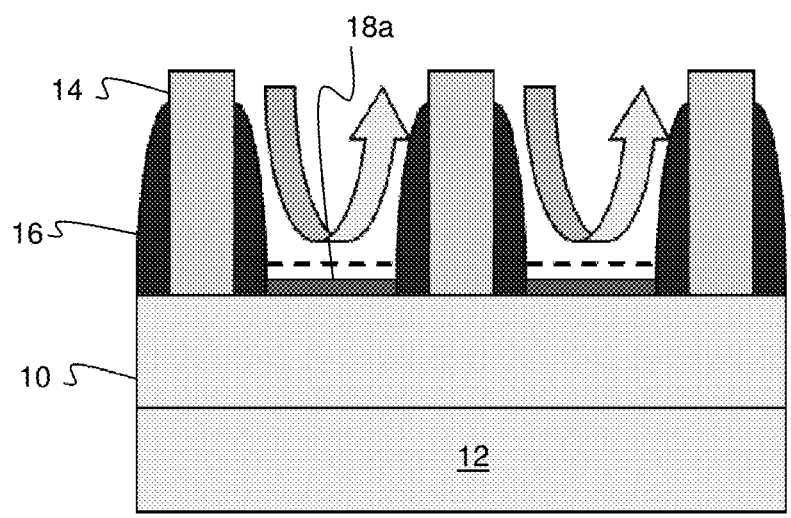
FIG. 3 shows a structure with a thinned buffer layer and respective fabrication processes in accordance with aspects of the present disclosure.

In FIG. 3, the epitaxial layer (buffer layer) can be thinned as represented by reference numeral 18a. In embodiments, and as discussed in more detail below, it has been found by the inventors that the thickness of the buffer layer 18 will affect out-diffusion of dopant into the channel or extension region of the device, during an anneal process of the subsequently formed doped layer. Accordingly, the inventors have found that by engineering (e.g., adjusting or modulating a thickness profile) the epitaxial layer 18 (e.g., buffer layer), Vt characteristics of the device can be effectively adjusted. To this end, in embodiments, the method includes finding a particular device performance by correlating a thickness of the buffer layer to out-diffusion of dopant into extension regions during annealing of a doped layer formed on the buffer layer. By knowing the particular correlation and hence thickness of the buffer layer 18, it is possible to thin the buffer layer to a predetermined thickness to adjust device performance characteristics. Specifically, the epitaxial layer 18a can be thinned to approximately a thickness of about 5 Å to about 100 Å in order to adjust device parameters; although other thicknesses are contemplated by the present disclosure. The epitaxial layer 18a can be thinned using lithography and etching processes. In embodiments, a wet etching process (e.g., $NH_4OH:H_2O_2$ (Industry standard SC1 solution)) can be used to thin down the epitaxial layer 18a on selective devices.

Figure 4:
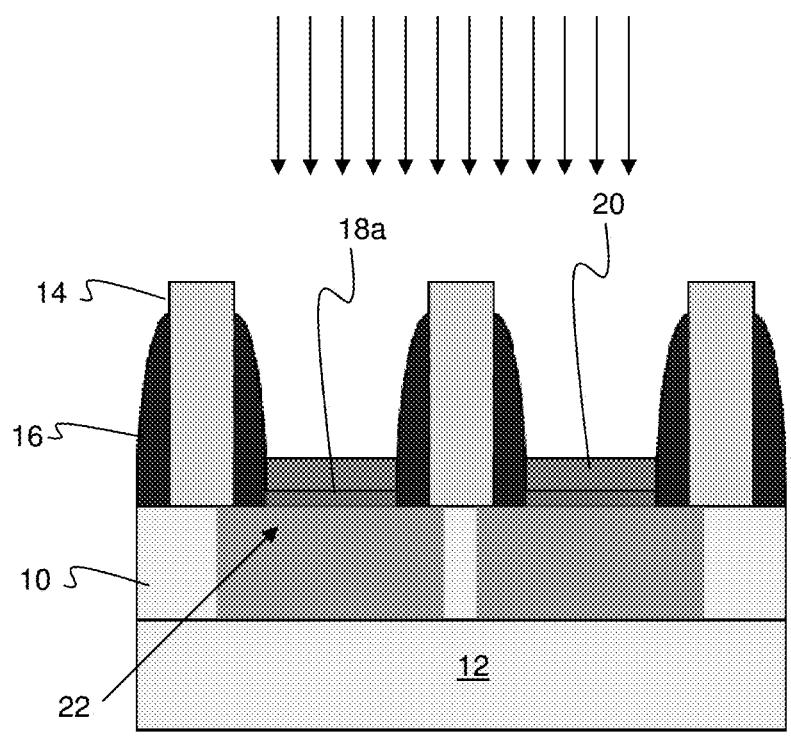
FIG. 4 shows a structure with a doped epitaxial layer on the buffer layer and respective fabrication processes in accordance with aspects of the present disclosure.

Referring to FIGS. 3 and 4, a doped epitaxial material 20 (e.g., stress layer) is grown on the buffer layer, i.e., epitaxial layer 18 (or thinned epitaxial layer 18a). In embodiments, the doped epitaxial material 20 can boron doped SiGe material for a pFET device, or arsenic or phosphorous doped SiC material for an nFET device. It should be understood by those of skill in the art that the SiGe material will cause a compressive stress on the pFET thus enhancing performance, whereas, the SiC material will cause a tensile stress on the nFET thus enhancing performance. In either scenario, the doped epitaxial material 20 will undergo an annealing process at a temperature ranging from about 800° C. to about 1100° Cm which will cause out-diffusion of the dopant (e.g., boron, arsenic or phosphorous) into the extension regions 22.

The out-diffusion of the dopant, e.g., boron, into the extension region 22 will affect, e.g., the pFET short channel voltage threshold (Vt), whereas, the out-diffusion of the dopant, e.g., arsenic or phosphorous, will affect, e.g., the nFET short channel voltage threshold (Vt). It has been found by the inventors, though, that the thickness of the buffer layer, i.e., epitaxial layer 18, plays an important role on the amount of dopant that out-diffuses into the extension region 22 during the anneal process. To this end, it has been found by the inventors that depending on device requirements, it is possible to obtain different voltage thresholds of the device by adjusting the thickness of the buffer layer, i.e., epitaxial layer 18.

For example, it has been found by the inventors that a thinner buffer layer, i.e., epitaxial layer 18a, will induce more out-diffusion of dopant (e.g., boron, arsenic or phosphorous) leading to a lower FET short channel voltage threshold (Vt); whereas, a thicker buffer layer, i.e., epitaxial layer 18a, will induce less out-diffusion of dopant leading to a higher FET short channel voltage threshold (Vt). More specifically, for a pFET device, a thinner buffer layer, i.e., epitaxial layer 18a, will induce more out-diffusion of boron leading to a lower pFET short channel voltage threshold (Vt); whereas, a thicker buffer layer, i.e., epitaxial layer 18a, will induce less out-diffusion of boron leading to a higher pFET short channel voltage threshold (Vt). Similar results occur with nFET devices and out-diffusion of either arsenic or phosphorous. In embodiments, Arsenic is used as implanted species for nFET source drain, and phos is used as in situ dopant for nFET EPI process. Diffusion of both affect the Vt of the nFET device. Putting a SiC buffer should retard the diffusion of both species.

Figure 5:
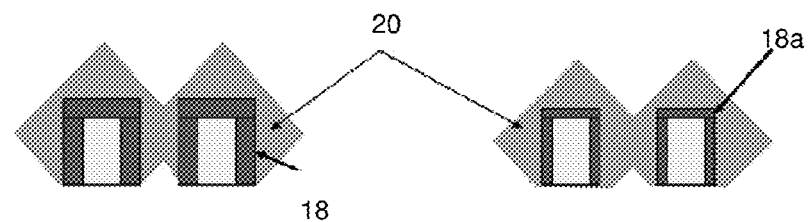
FIG. 5 shows a cross sectional view of perpendicular to a FIN showing EPI growth in accordance with aspects of the invention.

FIG. 5 shows a cross sectional view of perpendicular to a FIN showing EPI growth in accordance with aspects of the invention. This view shows both a doped thinned layer buffer material 18a and a thicker layer of buffer material 18. Doped epitaxial material 20 is formed on the thinned layer buffer material 18a and a thicker layer of buffer material 18 as already described herein.

Figure 6:
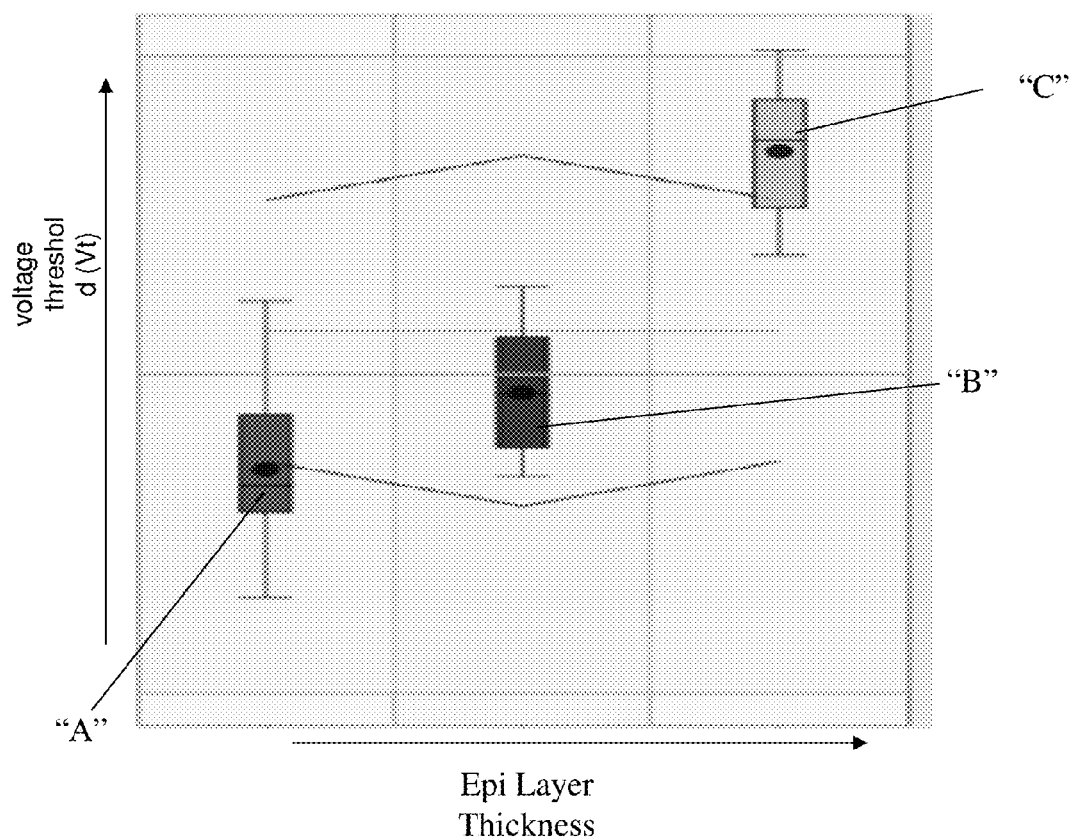
FIG. 6 is a graph showing a buffer layer thickness vs. pFET short channel Vt in accordance with aspects of the present disclosure.

FIG. 6 shows a graph of SiGe layer (e.g., buffer layer) thickness vs. pFET short channel Vt. In this graph, the "x" axis represents a thickness of SiGe material, with device "A"

having the thickest SiGe layer (process of record) and device "B" and device "A" having progressively thinner SiGe layers. For example, the delta thickness of SiGe between device "B" and device "C" can be about 7 Å. The "y" axis represents the pFET short channel voltage threshold (Vt). In this example, device "C" has the thinnest SiGe layer and will also have the lowest pFET short channel voltage threshold (Vt), e.g., 70 mV.

It has also been found by the inventors that the Ge % of C % concentration of the buffer layer, i.e., epitaxial layer 18 (whether or not thinned) or of the doped epitaxial material 20 can be used to modulate the out-diffusion of the dopants from the doped epitaxial material 20. For example, an increase of Ge % in the doped epitaxial material 20 (e.g., SiGe) will reduce the boron out-diffusion and hence increase the pFET short channel voltage threshold (Vt). Similarly, an increase of C % in the doped epitaxial material 20 (e.g., SiC) will reduce the arsenic or phosphorous out-diffusion and hence increase the nFET short channel voltage threshold (Vt). Thus, concentrations of Ge or C in the doped epitaxial layer 20 (of SiGe or SiC, respectively), can be adjusted in order to modulate out-diffusion.

Figure 7:
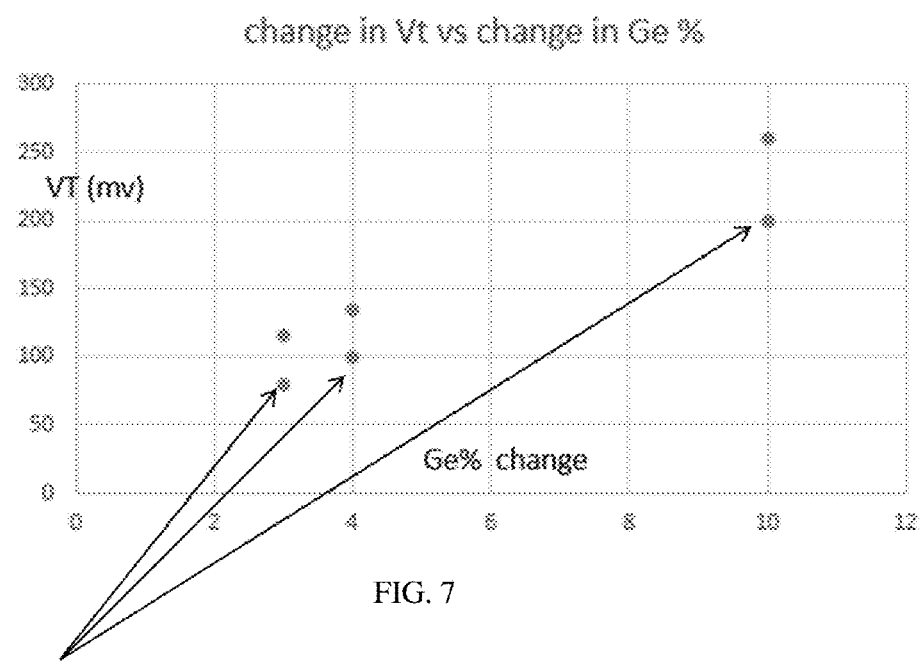
FIG. 7 shows the relationship of out-diffusion and Ge % concentration in accordance with aspects of the present disclosure.

FIG. 7 shows the relationship of out-diffusion and Ge % concentration in accordance with aspects of the present disclosure. This graph shows Vt over percentage of Ge change.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming an epitaxially grown buffer layer between the sidewalls or spacers of adjacent gate structures; and
    adjusting device performance characteristics by adjusting a thickness of the buffer layer to modulate out diffusion of dopant into extension regions of a device during annealing of a subsequently formed doped layer on the buffer layer.

2. The method of claim 1, wherein the adjusting the thickness of the buffer layer includes thinning of the buffer layer through an etching process, prior to the forming of the doped layer.

3. The method of claim 1, wherein the dopant is boron.

4. The method of claim 3, wherein the doped layer is epitaxial grown SiGe.

5. The method of claim 4, further comprising modulating a percent concentration of Ge in the epitaxial grown SiGe to control out diffusion of the boron.

6. The method of claim 1, wherein the dopant is arsenic or phosphorous.

7. The method of claim 6, wherein the doped layer is epitaxial grown SiC.

8. The method of claim 7, further comprising modulating a percent concentration of C in the epitaxial grown SiC to control out diffusion of the arsenic or phosphorous.

9. The method of claim 1, wherein the buffer layer is epitaxial grown SiGe material.

10. The method of claim 9, further comprising modulating a percent concentration of Ge in the epitaxial grown SiGe material to control out diffusion of the dopant.

11. The method of claim 1, wherein the adjusting device performance characteristics is voltage threshold.

12. The method of claim 1, wherein a thinner buffer layer induces more out diffusion of the dopant leading to a lower FET short channel voltage threshold (Vt) compared to a thicker buffer layer which induce less out diffusion of the dopant leading to a higher FET short channel voltage threshold (Vt).

13. A method comprising:
    controlling out diffusion of dopant from a doped epitaxial grown layer by adjusting Ge % of C % concentration of the doped epitaxial grown layer; and
    adjusting a thickness of a buffer layer which is formed underlying the doped epitaxial grown layer and on a semiconductor material forming fin structures,
    wherein the gate structures are formed over the fin structures and the buffer layer is formed between adjacent gate structures.

14. The method of claim 13, wherein the epitaxial grown layer is one of SiGe and SiC.

15. The method of claim 14, wherein the dopant is boron.

16. The method of claim 14, wherein the dopant is arsenic or phosphorous.

17. The method of claim 13, wherein the buffer layer is SiGe material.

18. The method of claim 13, further comprising adjusting a concentration of Ge % or C % of a buffer layer which is formed underlying the doped epitaxial grown layer.

19. A method comprising:
    forming gate structures over fin structures;
    forming a buffer layer adjacent to the gate structures and on semiconductor material forming the fin structures;
    forming a doped layer on the buffer layer such that the buffer layer is located between the semiconductor material of the fin structures and the buffer layer;
    annealing the doped layer to out diffuse dopant into extension regions; and
    adjusting an out diffusion of the dopant during the annealing by one of: adjusting a thickness of the buffer layer by an etching process and adjusting a concentration of Ge % or C % of the doped layer.

* * * * *